(12) United States Patent
Zhang

(10) Patent No.: US 11,632,100 B2
(45) Date of Patent: Apr. 18, 2023

(54) METHOD FOR DATA STORAGE AND COMPARISON, STORAGE COMPARISON CIRCUIT DEVICE, AND SEMICONDUCTOR MEMORY

(71) Applicant: CHANGXIN MEMORY TECHNOLOGIES, INC., Hefei (CN)

(72) Inventor: Liang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 15 days.

(21) Appl. No.: 17/178,250

(22) Filed: Feb. 18, 2021

(65) Prior Publication Data
US 2021/0175877 A1    Jun. 10, 2021

Related U.S. Application Data

(63) Continuation of application No. PCT/CN2020/097334, filed on Jun. 22, 2020.

(30) Foreign Application Priority Data

Oct. 8, 2019    (CN) .......................... 201910949145.9

(51) Int. Cl.
*H03K 3/037* (2006.01)
*G11C 11/412* (2006.01)
(Continued)

(52) U.S. Cl.
CPC ............ *H03K 3/037* (2013.01); *G11C 11/412* (2013.01); *H03K 5/2472* (2013.01); *H03K 19/09425* (2013.01)

(58) Field of Classification Search
CPC ........ H03K 3/02; H03K 3/023; H03K 3/0233; H03K 3/027; H03K 3/037; H03K 3/353;
(Continued)

(56) References Cited

U.S. PATENT DOCUMENTS 10,763,835 B2 *    9/2020    Lee ...................... H03K 17/223
2013/0106461 A1    5/2013    Ficke et al.
(Continued)

FOREIGN PATENT DOCUMENTS

CN        102237367 A        11/2011
CN        102237867 A        11/2011
(Continued)

*Primary Examiner* — Long Nguyen
(74) *Attorney, Agent, or Firm* — Kilpatrick Townsend & Stockton LLP

(57) ABSTRACT

Embodiments provide a method for data storage and comparison, a storage comparison circuit device, and a semiconductor memory. The storage comparison circuit device includes a latch and a comparator. The latch is configured to latch inputted first input data and output first output data and second output data. The first output data are the same as the first input data, whereas the second output data are different from the first input data, wherein the first output data and the second output data are respectively inputted into the comparator. The comparator is configured to receive second input data, the first output data and the second output data, and to output a comparison result. By using modular structures of the latch and the comparator, device data can be simplified for the latch and the comparator, chip area can be reduced, calculation amount can be reduced, and efficiency of data comparison can be improved.

10 Claims, 2 Drawing Sheets

(51) Int. Cl.
*H03K 5/24* (2006.01)
*H03K 19/094* (2006.01)

(58) Field of Classification Search
CPC ............ H03K 3/356; H03K 3/356052; H03K 3/356104; H03K 3/356113; H03K 3/356147; H03K 5/22; H03K 5/24; H03K 5/2472; H03K 5/249; H03K 19/094; H03K 19/09425; H03K 19/0944; H03K 19/0948; G11C 11/41; G11C 11/412
See application file for complete search history.

(56) References Cited

U.S. PATENT DOCUMENTS

2019/0372562 A1* 12/2019 Lee .................. G01R 19/16595
2020/0204184 A1* 6/2020 Rattan .................... H03M 1/38

FOREIGN PATENT DOCUMENTS

| CN | 109768797 A | 5/2019 |
| CN | 210490817 U | 5/2020 |

\* cited by examiner

METHOD FOR DATA STORAGE AND COMPARISON, STORAGE COMPARISON CIRCUIT DEVICE, AND SEMICONDUCTOR MEMORY

CROSS REFERENCE

This application is a continuation of PCT/CN2020/097334, filed on Jun. 22, 2020, which claims priority to Chinese Patent Application No. 201910949145.9, titled "METHOD FOR DATA STORAGE AND COMPARISON, STORAGE COMPARISON CIRCUIT DEVICE, AND SEMICONDUCTOR MEMORY" and filed to the State Patent Intellectual Property Office on Oct. 8, 2019, the entire contents of which are incorporated herein by reference.

TECHNICAL FIELD

The present disclosure relates to the field of semiconductor integrated circuit technologies, and more particularly, to a method for data storage and comparison, a storage comparison circuit device, and a semiconductor memory.

BACKGROUND

At present, a common memory comparator includes a latch and an XNOR gate. The latch is a level-triggered memory cell, and a data storage action (state transition) depends on a level value of an input clock (or enable) signal. When the latch is in an enabled state, an output may change with data input. One of two input terminals of the XNOR gate is configured to input first data, and the other input terminal is connected to an output terminal of the latch. Second data may be inputted into the latch, and time-delay data are obtained after the second data are delayed by the latch. The time-delay data are inputted to the other input terminal of the XNOR gate. Finally, an output signal is obtained after the first data and the time-delay data are compared by the XNOR gate. However, in an existing storage comparator, the latch and the XNOR gate have complicated internal structure and large area. When such circuit units are used too much, too large chip area may be caused, and thus chip costs may be increased.

The above information disclosed in this background art is only for the purpose of enhancing the understanding of the background of the present disclosure, and thus it may include information which does not constitute prior art known to those of ordinary skill in the art.

SUMMARY

The present disclosure provides a method for data storage and comparison, a storage comparison circuit device, and a semiconductor memory to overcome or alleviate one or more problems in the background art, or to at least provide a beneficial choice.

In a first aspect, there is provided a storage comparison circuit device, which includes a latch and a comparator. The latch is configured to latch inputted first input data and output first output data and second output data. The first output data are the same as the first input data, whereas the second output data are different from the first input data, wherein the first output data and the second output data are respectively inputted into the comparator.

The comparator is configured to receive second input data, the first output data and the second output data, and to output a comparison result.

In one embodiment, the latch includes a transmission gate, an inverter, and a tri-state gate.

An input terminal of the transmission gate is configured to input the first input data, an output terminal of the transmission gate is connected to an input terminal of the inverter, an output terminal of the inverter is connected to an input terminal of the tri-state gate, and an output terminal of the tri-state gate is connected to the output terminal of the transmission gate. The transmission gate further includes a transmission gate control terminal, the tri-state gate further includes a tri-state gate control terminal, the transmission gate control terminal and the tri-state gate control terminal are configured to receive a control signal, the control signal is configured for controlling to enable the transmission gate and to disable the tri-state gate, such that the output terminal of the transmission gate outputs the first output data, and the output terminal of the inverter outputs the second output data. Alternatively, the control signal is configured for controlling to disable the transmission gate and to enable the tri-state gate, such that the output terminal of the inverter outputs the second output data.

In one embodiment, the comparator includes a first input terminal, a second input terminal and a third input terminal. The first input terminal is configured to receive the second input data, the second input terminal is configured to receive the first output data, the third input terminal is configured to receive the second output data, and the output terminal of the comparator is configured to output the comparison result.

In one embodiment, the transmission gate control terminal includes a first control terminal and a second control terminal. The tri-state gate control terminal includes a third control terminal and a fourth control terminal. Both the first control terminal and the third control terminal are connected to a gate of a PMOS transistor, and both the second control terminal and the fourth control terminal are connected to a gate of an NMOS transistor.

The transmission gate is controlled to be enabled when the first control terminal inputs a low level and the second control terminal inputs a high level. The tri-state gate is in a high impedance state if the third control terminal inputs a high level and the fourth control terminal inputs a low level.

The transmission gate is controlled to be disabled when the first control terminal inputs the high level and the second control terminal inputs the low level. The tri-state gate is enabled when the third control terminal inputs the low level and the fourth control terminal inputs the high level.

In one embodiment, the comparator includes a first transistor and a second transistor connected in series, and a third transistor and a fourth transistor connected in parallel.

A gate of the first transistor and a gate of the second transistor are connected to a first connection point, a source of the third transistor and a source of the fourth transistor are connected to a second connection point, and the first connection point and the second connection point are connected to the first input terminal.

A source of the first transistor and a gate of the third transistor are connected to the third input terminal, and the third input terminal is connected to the output terminal of the inverter.

A source of the second transistor and a gate of the fourth transistor are connected to the second input terminal, and the second input terminal is connected to the input terminal of the inverter.

A drain of the first transistor and a drain of the second transistor are connected to a third connection point, a drain of the third transistor and a drain of the fourth transistor are connected to a fourth connection point, and the third connection point and the fourth connection point are connected to the output terminal of the comparator.

In a second aspect, there is provided a semiconductor memory, which includes the storage comparison circuit device according to any one of the above embodiments.

In a third aspect, there is provided a method for data storage and comparison, which is applied to the storage comparison circuit device according to any one of the above embodiments, and the method for data storage and comparison includes:

inputting first input data to a transmission gate to output first output data and inputting the first output data to an inverter in a latch to output second output data when controlling the transmission gate in the latch to be enabled and a tri-state gate in the latch to be disabled according to a control signal;

inputting the second output data to the tri-state gate to output the first output data when controlling the transmission gate to be disabled and the tri-state gate to be enabled according to the control signal; and inputting second input data, the first output data and the second output data into a comparator to output a comparison result.

In one embodiment, the inputting second input data, the first output data and the second output data into a comparator to output a comparison result includes:

the outputted comparison result is a logic signal 1 when the second input data are the same as the first output data; and the outputted comparison result is a logic signal 0 when the second input data are the same as the second output data.

The technical solutions used by the present disclosure have the following advantages. By using modular structures of the latch and the comparator, device data can be simplified for the latch and the comparator, chip area can be reduced, and meanwhile calculation amount can be reduced, and efficiency of data comparison can be improved.

The above summary is for the purpose of illustration only and is not intended to be limiting in any way. In addition to the illustrative aspects, embodiments, and features described above, further aspects, embodiments, and features of the present disclosure will be readily apparent by reference to the drawings and the following detailed description.

BRIEF DESCRIPTION OF THE DRAWINGS

In the drawings, the same reference numerals denote the same or similar parts or elements throughout the several drawings unless otherwise specified. These drawings are not necessarily drawn to scale. It should be understood that these drawings depict only some embodiments according to the present disclosure and should not be taken as limiting the scope of the present disclosure. The drawings are used for a better understanding of the solutions, and do not constitute a limitation on this application, in which.

DETAILED DESCRIPTION

Figure 1:
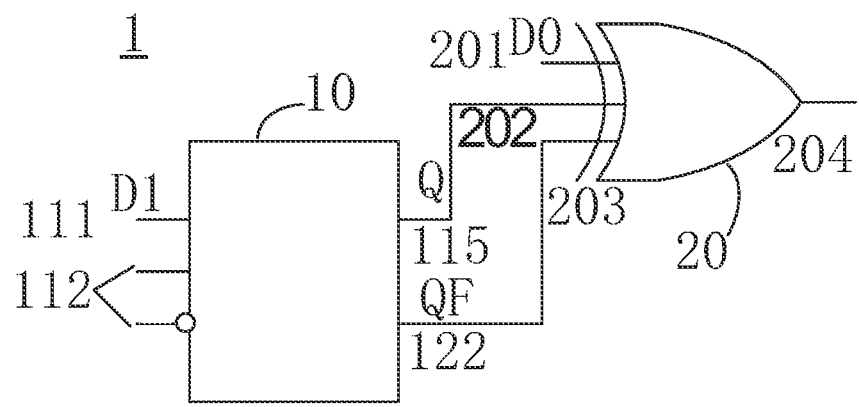
FIG. 1 is a schematic structural diagram of a storage comparison circuit device according to an embodiment of the present disclosure.

In the following, only certain exemplary embodiments are simply described. As those skilled in the art would realize, the described embodiments may be modified in various different ways without departing from the spirit or scope of the present disclosure. Accordingly, the drawings and description are to be regarded as illustrative in nature and not as restrictive.

In the description of the present disclosure, it is to be understood that the orientations or positions represented by the terms of "center", "longitudinal", "transverse", "length", "width", "thickness", "up", "down", "front", "back", "left", "right", "vertical", "horizontal", "top", "bottom", "in", "out", "clockwise", "anticlockwise", "axial", "radial", "circumferential", and the like are based on the orientations or positions as shown in the accompanying figures, they are merely for ease of a description of the present disclosure and a simplified description instead of being intended to indicate or imply the device or element to have a special orientation or to be configured and operated in a special orientation. Thus, they cannot be understood as limiting of the present disclosure.

REFERENCE NUMERALS IN THE DRAWINGS latch 10;

transmission gate 110, input terminal 111 of the transmission gate, output terminal 115 of the transmission gate, transmission gate control terminal 112, first control terminal 113, and second control terminal 114;

inverter 120, input terminal 121 of the inverter, and output terminal 122 of the inverter;

tri-state gate 130, input terminal 131 of the tri-state gate, output terminal 132 of the tri-state gate, tri-state gate control terminal 133, third control terminal 134, and fourth control terminal 135;

comparator 20;

first input terminal 201, second input terminal 202, third input terminal 203, and output terminal 204 of the comparator; and first transistor 210, second transistor 220, third transistor 230, and fourth transistor 240.

In addition, terms "first" and "second" are used only for purposes of description and are not intended to indicate or imply relative importance or to imply the number of indicated technical features. Thus, the feature defined with "first" and "second" may explicitly or implicitly include at least one such feature. In the description of the present disclosure, "a plurality of" refers to at least two, unless otherwise expressly specified.

In the present disclosure, it is to be noted that unless specified or limited otherwise, terms such as "installation", "connecting", "connection" or "fixation" should be understood in a broad sense, which may be, for example, a fixed connection, a detachable connection or integrated connection, a mechanical connection or an electrical connection or a communication connection, a direct connection or indirect connection by means of an intermediary, an internal communication between two components or an interaction relationship between two components. For those of ordinary skill in the art, specific meanings of the above terms in the present disclosure may be understood based on specific circumstances.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. A first feature "below," "under," or "underneath" a second feature may include an embodiment in which the first feature is right or obliquely "below," "under," or "underneath" the second feature, or just means that the first feature is at a height lower than that of the second feature.

The following disclosure provides a plurality of different embodiments or examples to implement different structures of the present disclosure. To simplify the disclosure of the present disclosure, components and settings in particular examples are described hereinafter. Certainly, these examples are merely for illustrative purposes, and are not intended to limit the present disclosure. In addition, in the present disclosure, reference numerals and/or reference letters may be repeated in different examples. This repetition is for the purpose of simplicity and clarity, and does not in itself indicate a relationship between the various embodiments and/or settings that are discussed. In addition, the present disclosure provides examples of various particular processes and materials, but a person of ordinary skill in the art may realize that other processes and/or materials may be applied and/or used.

Embodiment I

In an embodiment, there is provided a storage comparison circuit device as shown in FIG. 1. The storage comparison circuit device 1 includes a latch 10 and a comparator 20. The latch 10 is configured to latch inputted first input data and output first output data and second output data. The first output data are the same as the first input data, whereas the second output data are different from the first input data, wherein the first output data and the second output data are respectively inputted into the comparator 20. The comparator 20 is configured to receive second input data, the first output data and the second output data, and to output a comparison result. As a memory cell circuit sensitive to a pulse level, the latch can change a state under the action of a specific input pulse level. Latching refers to temporarily storing a signal to maintain a certain level state. The most important function of the latch is to cache. The comparator compares two or more data items to determine whether they are equal, or to determine the size relationship and arrangement order between them. A circuit or device that can implement this comparison function is referred to as a comparator. The comparator is a circuit that compares an analog voltage signal with a reference voltage.

Figure 2:
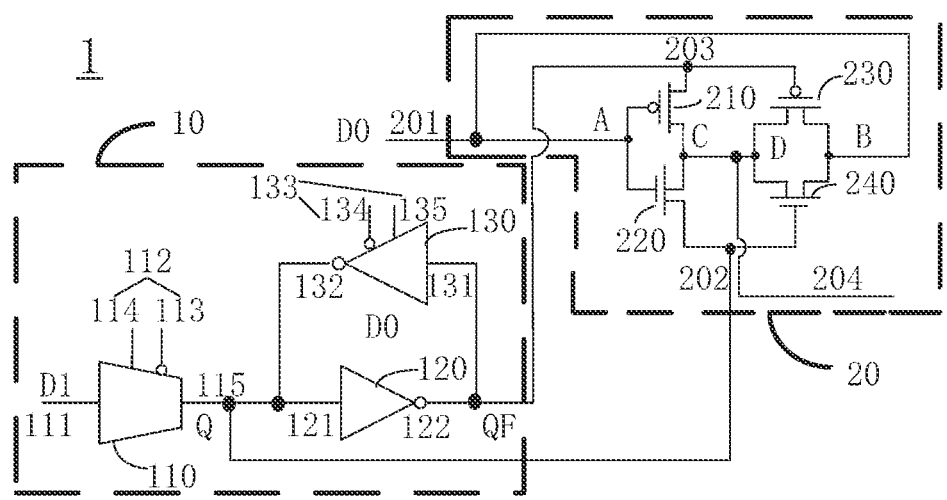
FIG. 2 is a schematic diagram showing internal structures of a latch and a comparator according to an embodiment of the present disclosure.

In one embodiment, as shown in FIG. 2, the latch 10 includes a transmission gate 110, an inverter 120, and a tri-state gate 130. An internal connection relationship of the latch 10 is as below. An input terminal 111 of the transmission gate is configured to input the first input data D1, an output terminal 115 of the transmission gate is connected to an input terminal 121 of the inverter, an output terminal 122 of the inverter is connected to an input terminal 131 of the tri-state gate, and an output terminal 132 of the tri-state gate is connected to the output terminal 115 of the transmission gate. The transmission gate 110 further includes a transmission gate control terminal 112, and the tri-state gate 130 further includes a tri-state gate control terminal 133. The transmission gate control terminal 112 and the tri-state gate control terminal 133 are configured to receive a control signal, wherein the control signal is configured for controlling to enable the transmission gate 110 and to disable the tri-state gate 130, such that the output terminal 115 of the transmission gate outputs the first output data Q, and the output terminal 122 of the inverter outputs the second output data QF. Alternatively, the control signal is configured for controlling to disable the transmission gate 110 and to enable the tri-state gate 130, such that the output terminal 122 of the inverter outputs the second output data QF.

The comparator 20 includes a first input terminal 201, a second input terminal 202 and a third input terminal 203. The first input terminal 201 is configured to receive the second input data D0, the second input terminal 202 is configured to receive the first output data Q, the third input terminal 203 is configured to receive the second output data QF, and the output terminal 204 of the comparator is configured to output the comparison result.

In an example, when the control signal controls the transmission gate 110 to be enabled and the tri-state gate 130 is in a high impedance state, the first input data D1 inputted into the transmission gate 110 may be a logic signal 1. After the first input data D1 are processed by the transmission gate 110, the obtained first output data Q may be the logic signal 1. After the first output data Q are processed by the inverter 120, the second output data QF obtained may be a logic signal 0. It is to be pointed out that the first output data Q can represent the same data information as the first input data D1, and the second output data QF can represent data information different from the first input data D1. The first input terminal 201 of the comparator 20 receives the second input data D0, and the second input data D0 may be the logic signal 0 or the logic signal 1. The first output data Q being the logic signal 1 are inputted to the second input terminal 202 of the comparator 20, and the second output data QF being the logic signal 0 are inputted to the third input terminal 203 of the comparator 20.

When the second input data D0 are the logic signal 0, the first output data Q are logic signal 1, and the second output data QF are the logic signal 0, the comparison result outputted by the output terminal 204 of the comparator is the logic signal 0. The first output data Q can represent the same data information as the first input data D1, and the second output data QF can represent data information different from the first input data D1. Therefore, this comparison result indicates that the first input data D1 being the logic signal 1 are different from the second input data D0 being the logic signal 0, and the comparison result is outputted as 0.

When the second input data D0 are the logic signal 1, the first output data Q are the logic signal 1, and the second output data QF are the logic signal 0, the comparison result outputted by the output terminal 204 of the comparator is the logic signal 1. The first output data Q can represent the same data information as the first input data D1, and the second output data QF can represent data information different from the first input data D1. Therefore, this comparison result indicates that the first input data D1 being the logic signal 1 are the same as the second input data D0 being the logic signal 1, and the comparison result is outputted as 1.

When the control signal controls the transmission gate 110 to be disabled and the tri-state gate 130 is enabled, the first input data D1 inputted to the transmission gate 110 cannot enter the transmission gate anyhow. At this moment, the tri-state gate 130 is enabled, such that the second output data QF are inputted to the tri-state gate 130, and the first output data Q are outputted from the tri-state gate 130. In this way, the first input data D1 inputted before the transmission gate 110 is disabled are latched. At this moment, reference may bee made to the aforementioned process for the comparison result outputted from the comparator 20, which will not be repeated here. By using modular structures of the latch in this embodiment, device data can be simplified for the latch, chip area can be reduced, and meanwhile calculation amount can be reduced, and a latch effect on input data can be guaranteed.

In one embodiment, in the latch 10, the transmission gate control terminal 112 includes a first control terminal 113 and a second control terminal 114. The tri-state gate control terminal 133 includes a third control terminal 134 and a fourth control terminal 135. Both the first control terminal 113 and the third control terminal 134 are connected to a gate of a PMOS transistor, and both the second control terminal 114 and the fourth control terminal 135 are connected to a gate of an NMOS transistor. The transmission gate 110 is controlled to be enabled when the first control terminal 113 inputs a low level and the second control terminal 114 inputs a high level. The tri-state gate 130 is in a high impedance state if the third control terminal 134 inputs a high level and the fourth control terminal 135 inputs a low level. The transmission gate 110 is controlled to be disabled when the first control terminal 113 inputs the high level and the second control terminal 114 inputs the low level. The tri-state gate 130 is enabled when the third control terminal 134 inputs the low level and the fourth control terminal 135 inputs the high level.

In an example, the gate of the NMOS is enabled at a high level and disabled at a low level, such that an enabled state between the NMOS and the earth can be controlled. The gate of the PMOS is enabled at a low level and disabled at a high level, such that an enabled state between the PMOS and a power supply can be controlled. According to the foregoing principles, the control signal controls the enabled state and the disabled state of the transmission gate 110 and the tri-state gate 130 to achieve the latching of the first input data D1.

In one embodiment, the comparator 20 includes a first transistor 210 and a second transistor 220 connected in series, and a third transistor 230 and a fourth transistor 240 connected in parallel. A gate of the first transistor 210 and a gate of the second transistor 220 are connected to a first connection point A, a source of the third transistor 230 and a source of the fourth transistor 240 are connected to a second connection point B, and the first connection point A and the second connection point B are connected to the first input terminal 201. A source of the first transistor 210 and a gate of the third transistor 230 are connected to the third input terminal 203, and the third input terminal 203 is connected to the output terminal 122 of the inverter. A source of the second transistor 220 and a gate of the fourth transistor 240 are connected to the second input terminal 202, and the second input terminal 202 is connected to the input terminal 121 of the inverter. A drain of the first transistor 210 and a drain of the second transistor 220 are connected to a third connection point C, a drain of the third transistor 230 and a drain of the fourth transistor 240 are connected to a fourth connection point D, and the third connection point C and the fourth connection point D are connected to the output terminal 204 of the comparator.

By using modular structures of the comparator in this embodiment, device data can be simplified for the comparator, chip area can be reduced, and meanwhile calculation amount can be reduced, and a comparison effect on the first input data D1 and the second input data D0 can be guaranteed.

Embodiment II

In another embodiment, there is provided a semiconductor memory, which includes the storage comparison circuit device according to any one of the above embodiments.

Embodiment III

Figure 3:
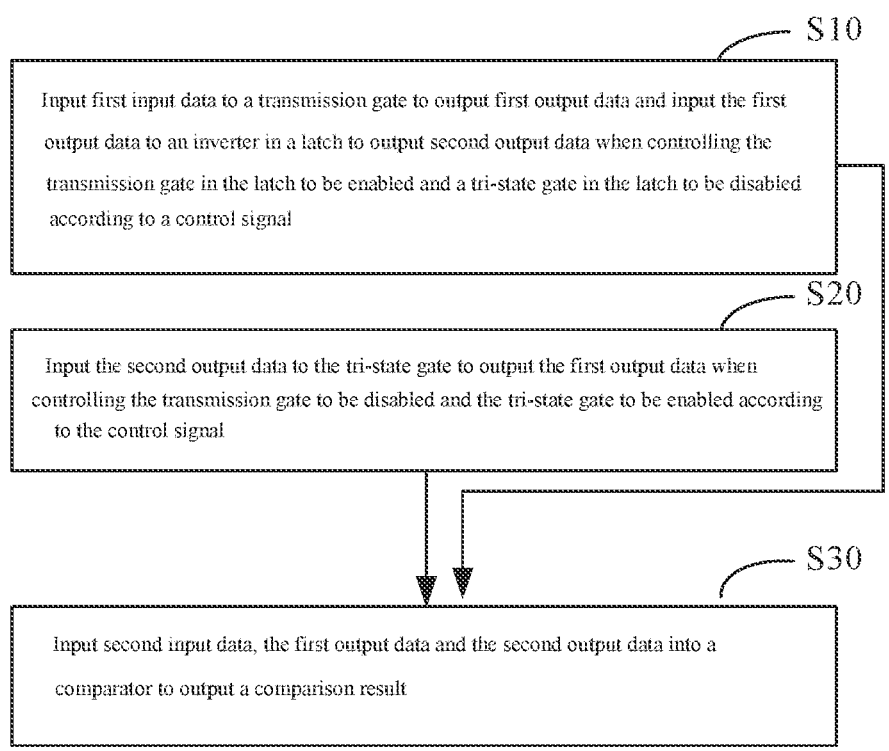
FIG. 3 is a method for data storage and comparison according to an embodiment of the present disclosure.

In one embodiment, as shown in FIG. 3, there is provided a method for data storage and comparison, which is applied to the storage comparison circuit device in Embodiment I, and the method for data storage and comparison includes following steps:

Step S10: inputting first input data to a transmission gate to output first output data and inputting the first output data to an inverter in a latch to output second output data when controlling the transmission gate in the latch to be enabled and a tri-state gate in the latch to be disabled according to a control signal; or Step S20: inputting the second output data to the tri-state gate to output the first output data when controlling the transmission gate to be disabled and the tri-state gate to be enabled according to the control signal; and Step S30: inputting second input data, the first output data and the second output data into a comparator to output a comparison result.

In one embodiment, Step S30 includes:

determining the outputted comparison result as a logic signal 1 when the second input data are the same as the first output data; or determining the outputted comparison result as a logic signal 0 when the second input data being the same as the second output data.

The technical solutions used by the present disclosure have the following advantages: by using modular structures of the latch and the comparator, device data can be simplified for the latch and the comparator, chip area can be reduced, and meanwhile calculation amount can be reduced, and efficiency of data comparison can be improved.

The foregoing embodiments do not constitute a limitation on the protection scope of the present disclosure. Those skilled in the art should understand that various modifications, combinations, sub-combinations and substitutions can be made according to design requirements and other factors. All modifications, equivalent substitutions and improvements made within the spirit and principle of the present disclosure shall fall within the protection scope of the present disclosure.

What is claimed is:

1. A storage comparison circuit device, comprising a latch and a comparator, wherein the latch is configured to latch first input data, and output first output data and second output data, the first output data being the same as the first input data, and the second output data being different from the first input data, wherein the first output data and the second output data are respectively inputted into the comparator; and the comparator is configured to receive second input data, the first output data and the second output data to output a comparison result; and, wherein the latch comprises a transmission gate, an inverter, and a tri-state gate, wherein an input terminal of the transmission gate is configured to input the first input data, and an output terminal of the transmission gate is connected to an input terminal of the inverter;

an output terminal of the inverter is connected to an input terminal of the tri-state gate; and an output terminal of the tri-state gate is connected to the output terminal of the transmission gate; and, wherein the transmission gate further comprises a transmission gate control terminal;

the tri-state gate further comprises a tri-state gate control terminal;

the transmission gate control terminal and the tri-state gate control terminal are configured to receive a control signal; and the control signal is configured for:

controlling to enable the transmission gate and to disable the tri-state gate, such that the output terminal of the transmission gate outputs the first output data, and the output terminal of the inverter outputs the second output data; and controlling to disable the transmission gate and to enable the tri-state gate, such that the output terminal of the inverter outputs the second output data.

2. The storage comparison circuit device according to claim 1, wherein the comparator comprises a first input terminal, a second input terminal and a third input terminal, the first input terminal being configured to receive the second input data, the second input terminal being configured to receive the first output data, the third input terminal being configured to receive the second output data; and the output terminal of the comparator is configured to output the comparison result.

3. The storage comparison circuit device according to claim 1, wherein the transmission gate control terminal comprises a first control terminal and a second control terminal, the tri-state gate control terminal comprises a third control terminal and a fourth control terminal, both the first control terminal and the third control terminal being connected to a gate of a PMOS transistor, and both the second control terminal and the fourth control terminal being connected to a gate of an NMOS transistor;

the transmission gate is controlled to be enabled when the first control terminal inputs a low level and the second control terminal inputs a high level;

the tri-state gate is in a high impedance state when the third control terminal inputs the high level and the fourth control terminal inputs the low level;

the transmission gate is controlled to be disabled when the first control terminal inputs the high level and the second control terminal inputs the low level; and the tri-state gate is enabled when the third control terminal inputs the low level and the fourth control terminal inputs the high level.

4. The storage comparison circuit device according to claim 2, wherein the comparator comprises a first transistor and a second transistor connected in series, and a third transistor and a fourth transistor connected in parallel;

a gate of the first transistor and a gate of the second transistor are connected to a first connection point, a source of the third transistor and a source of the fourth transistor are connected to a second connection point, and the first connection point and the second connection point are connected to the first input terminal of the comparator;

a source of the first transistor and a gate of the third transistor are connected to the third input terminal of the comparator, and the third input terminal of the comparator is connected to the output terminal of the inverter;

a source of the second transistor and a gate of the fourth transistor are connected to the second input terminal of the comparator, and the second input terminal of the comparator is connected to the input terminal of the inverter; and a drain of the first transistor and a drain of the second transistor are connected to a third connection point, a drain of the third transistor and a drain of the fourth transistor are connected to a fourth connection point, and the third connection point and the fourth connection point are connected to the output terminal of the comparator.

5. A semiconductor memory comprising a storage comparison circuit device, wherein the storage comparison circuit device comprising a latch and a comparator, wherein the latch is configured to latch first input data, and output first output data and second output data, the first output data being the same as the first input data, and the second output data being different from the first input data, wherein the first output data and the second output data are respectively inputted into the comparator; and the comparator is configured to receive second input data, the first output data and the second output data to output a comparison result; and, wherein an input terminal of the transmission gate is configured to input the first input data, and an output terminal of the transmission gate is connected to an input terminal of the inverter;

an output terminal of the inverter is connected to an input terminal of the tri-state gate; and an output terminal of the tri-state gate is connected to the output terminal of the transmission gate; and, wherein the transmission gate further comprises a transmission gate control terminal;

the tri-state gate further comprises a tri-state gate control terminal;

the transmission gate control terminal and the tri-state gate control terminal are configured to receive a control signal; and the control signal is configured for:

controlling to enable the transmission gate and to disable the tri-state gate, such that the output terminal of the transmission gate outputs the first output data, and the output terminal of the inverter outputs the second output data; or controlling to disable the transmission gate and to enable the tri-state gate, such that the output terminal of the inverter outputs the second output data.

6. The semiconductor memory according to claim 5, wherein the comparator comprises a first input terminal, a second input terminal, a third input terminal and an output terminal, the first input terminal being configured to receive the second input data, the second input terminal being configured to receive the first output data, the third input terminal being configured to receive the second output data; and the output terminal of the comparator is configured to output the comparison result.

7. The semiconductor memory according to claim 5, wherein the transmission gate control terminal comprises a first control terminal and a second control terminal, the tri-state gate control terminal comprises a third control terminal and a fourth control terminal, both the first control terminal and the third control terminal being connected to a gate of a PMOS transistor, and both the second control terminal and the fourth control terminal being connected to a gate of an NMOS transistor;

the transmission gate is controlled to be enabled when the first control terminal inputs a low level and the second control terminal inputs a high level;

the tri-state gate is in a high impedance state when the third control terminal inputs the high level and the fourth control terminal inputs the low level;

the transmission gate is controlled to be disabled when the first control terminal inputs the high level and the second control terminal inputs the low level; and the tri-state gate is enabled when the third control terminal inputs the low level and the fourth control terminal inputs the high level.

8. The semiconductor memory according to claim 6, wherein the comparator comprises a first transistor and a second transistor connected in series, and a third transistor and a fourth transistor connected in parallel;

a gate of the first transistor and a gate of the second transistor are connected to a first connection point, a source of the third transistor and a source of the fourth transistor are connected to a second connection point, and the first connection point and the second connection point are connected to the first input terminal of the comparator;

a source of the first transistor and a gate of the third transistor are connected to the third input terminal of the comparator, and the third input terminal of the comparator is connected to the output terminal of the inverter;

a source of the second transistor and a gate of the fourth transistor are connected to the second input terminal of the comparator, and the second input terminal of the comparator is connected to the input terminal of the inverter; and a drain of the first transistor and a drain of the second transistor are connected to a third connection point, a drain of the third transistor and a drain of the fourth transistor are connected to a fourth connection point, and the third connection point and the fourth connection point are connected to the output terminal of the comparator.

9. A method for data storage and comparison performed by a storage comparison circuit device, the method comprising:

latching, by a latch, first input data, and outputting first output data and second output data, the first output data being the same as the first input data, and the second output data being different from the first input data;

receiving, by a comparator, second input data, the first output data and the second output data to output a comparison result;

inputting the first input data to a transmission gate in the latch to output the first output data and inputting the first output data to an inverter in the latch to output the second output data when the transmission gate is enabled and a tri-state gate in the latch is disabled according to a control signal; and inputting the second output data to the tri-state gate to output the first output data when the transmission gate is disabled and the tri-state gate is enabled according to the control signal.

10. The method according to claim 9, wherein the comparison result is a logic signal 1 when the second input data are the same as the first output data;

the comparison result is a logic signal 0 when the second input data are the same as the second output data.

\* \* \* \* \*